(12) United States Patent
Tamada

(10) Patent No.: US 7,622,754 B2
(45) Date of Patent: Nov. 24, 2009

(54) SEMICONDUCTOR DEVICE AND FABRICATION METHOD THEREOF

(75) Inventor: Hiroyuki Tamada, Kyoto-fu (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/149,568

(22) Filed: May 5, 2008

(65) Prior Publication Data

US 2008/0277688 A1 Nov. 13, 2008

(30) Foreign Application Priority Data

May 8, 2007 (JP) .............................. 2007-123461

(51) Int. Cl.
*H01L 29/739* (2006.01)
*H01L 21/336* (2006.01)
(52) U.S. Cl. .............................. 257/139; 257/E29.262; 257/E21.41; 257/E29.197
(58) Field of Classification Search .......... 257/139.331, 257/9, 341, E29.262, E21.41, E29.197, E21.384; 438/142, 270, 138, 212, 250
See application file for complete search history.

(56) References Cited

U.S. PATENT DOCUMENTS

RE38,953 E * 1/2006 Takahashi ................... 257/341
7,038,244 B2 * 5/2006 Ishigaki et al. ................ 257/94

FOREIGN PATENT DOCUMENTS

JP 11-274484 10/1999

* cited by examiner

*Primary Examiner*—Thomas L Dickey
*Assistant Examiner*—Nikolay Yushin
(74) *Attorney, Agent, or Firm*—Rabin & Berdo, PC

(57) ABSTRACT

A p-type collector layer is formed on a reverse side of an n-type high-resistivity first base layer, a p-type second base layer is formed on an obverse side of the first base layer, an emitter layer is formed on the second base layer, gate electrodes are formed inside trenches extending in a direction and intruding through the emitter layer and the second base layer into intermediate depths of the first base layer, with gate insulating films in between, a collector electrode is connected to the collector layer, an emitter electrode is connected to the emitter layer, the first base layer and the second base layer, the emitter layer is composed of first emitter layers extending along the trenches in the direction, and second emitter layers extending in a perpendicular direction for a ladder form interconnection between first emitter layers, and the base contact layer has a higher impurity density than the second base layer, and envelopes the second emitter layers.

22 Claims, 7 Drawing Sheets

SEMICONDUCTOR DEVICE AND FABRICATION METHOD THEREOF

CROSS REFERENCE TO RELATED APPLICATIONS AND INCORPORATION BY REFERENCES

This application is based upon and claims the benefit of priority from prior Japanese Patent Application NO. P2007-123461 filed on May 8, 2007, the entire contents of which are incorporated herein by reference.

BACKGROUND OF THE INVENTION

1. Field of the Invention

The present invention relates to a semiconductor device and a fabrication method thereof, and particularly, to a semiconductor device and a fabrication method thereof permitting an improved breakdown capability with low power dissipation (low on-state resistance, low saturation voltage) for metal oxide semiconductor field effect transistors (MOSFETs) and insulated gate bipolar transistors (IGBTs), additionally affording to realize a speedup of switching for IGBTs.

2. Description of the Related Art

There are vertical MOSFETs and vertical IGBTs proposed as semiconductor devices having a trench structure. They use sidewalls of trench as channel regions, and are easy to be short-channeled. The use of trench sidewalls as channel regions affords to have highly dense channel regions formed with a promising high current density.

For a vertical IGBT with a trench structure, a patent material 1*) has disclosed reducing the value of the on-state voltage.

Disclosed in the patent material 1 is an IGBT including: a p-type drain layer; a high resistivity n-type base layer provided on the p-type drain layer; a p-type base layer formed on a surface of the n-type base layer; n-type source regions formed on surface regions of the p-type base layer; gate electrodes formed inside trenches that intrude, between n-type source regions and through the p-type base layer, into intermediate depths of the n-type base layer, having gate oxide films interposed in between; and p-type contact regions formed on surface regions of the p-type base layer, contacting on n-type source regions, wherein the trenches are provided at preset intervals of 1.5 μm or less.

Patent material 1*): JP 11-274484 A (pp. 9-10, FIG. 1)

IGBTs in the past had, as illustrated in FIG. 1: a first base layer 2 of a first conductivity type, which had high resistivity; a collector layer 14 of a second conductivity type, which was formed on a reverse side of the first base layer 2; a second base layer 16 of the second conductivity type, which was formed on an obverse side of the first base layer 2; an emitter layer 13 of the first conductivity type, which was formed as a set of regions thereof on surface regions of the second base layer 16; gate electrodes 8 formed inside trenches extending in a first direction X and intruding, through the emitter layer 13 and the second base layer 16, into intermediate depths of the first base layer 2, having gate insulating films 6 interposed in between; and a base contact layer 4, which was formed as a set of regions thereof on surface regions of the second base layer 16, contacting on the emitter layer 13, extending in the first direction X, having a higher impurity density than the second base layer 16 of the second conductivity type. Interlayer insulating films 10 were provided on gate electrodes 8.

Though unshown in FIG. 1, a collector electrode was connected to the collector layer 14, and an emitter electrode was connected to the emitter layer 13 and the base contact layer 4.

For IGBTs in the past, for the breakdown capability to be increased, it was typical to form, as illustrated in FIG. 1, the base contact layer 4 as a set of $p^+$ diffusion regions between p regions constituting the second base layer 16. However, for this structure, the second base layer 16 made up by p regions had channel portions thereof too narrow to open enough to conduct large currents, resulting in an increased on-state resistance, leading to an increased saturation voltage, as well.

SUMMARY OF THE INVENTION

It is an object of the present invention to provide a semiconductor device including MOSFETs or IGBTs, and a fabrication method thereof, permitting an improved breakdown capability with low power dissipation (low on-state resistance, low saturation voltage), additionally affording to realize a speedup of switching for IGBTs.

According to an aspect of the present invention, a semiconductor device comprises a first base layer of a first conductivity type having high resistivity, a collector layer of a second conductivity type formed on a reverse side of the first base layer, a second base layer of the second conductivity type formed on an obverse side of the first base layer, an emitter layer of the first conductivity type formed on a surface of the second base layer, a set of gate electrodes formed inside trenches extending in a first direction and intruding through the emitter layer and the second base layer into intermediate depths of the first base layer, with gate insulating films in between, a collector electrode connected to the collector layer, and an emitter electrode connected to the emitter layer and the second base layer, wherein the emitter layer comprises a set of first emitter layers extending along the trenches in the first direction; and a set of second emitter layers extending in a second direction perpendicular to the first direction for a ladder form interconnection between first emitter layers, and the semiconductor device comprises a base contact layer having a higher impurity density than the second base layer of the second conductivity type, and configured to envelope second emitter layers.

According to another aspect of the present invention, a semiconductor device comprises a first base layer of a first conductivity type having high resistivity, a collector layer of a second conductivity type formed on a reverse side of the first base layer, a buffer layer of the first conductivity type formed on an obverse side of the first base layer, with a higher impurity density than the first base layer, a second base layer of the second conductivity type formed on a surface of the buffer layer, an emitter layer of the first conductivity type formed on a surface of the second base layer, a set of gate electrodes formed inside trenches extending in a first direction and intruding through the emitter layer and the second base layer into intermediate depths of the buffer layer, with gate insulating films in between, a collector electrode connected to the collector layer, and an emitter electrode connected to the emitter layer and the second base layer, wherein the emitter layer comprises a set of first emitter layers extending along the trenches in the first direction, and a set of second emitter layers extending in a second direction perpendicular to the first direction for a ladder form interconnection between first emitter layers, and the semiconductor device comprises a base contact layer having a higher impurity density than the second base layer of the second conductivity type, and configured to envelope second emitter layers.

According to another aspect of the present invention, a semiconductor device comprises a first base layer of a first conductivity type having high resistivity, a drain layer of the first conductivity type formed on a reverse side of the first base layer, a second base layer of a second conductivity type formed on an obverse side of the first base layer, a source layer of the first conductivity type formed on a surface of the second base layer, a set of gate electrodes formed inside trenches extending in a first direction and intruding through the source layer and the second base layer into intermediate depths of the first base layer, with gate insulating films in between, a drain electrode connected to the drain layer, and a source electrode connected to the source layer and the second base layer, wherein the source layer comprises a set of first source layers extending along the trenches in the first direction, and a set of second source layers extending in a second direction perpendicular to the first direction for a ladder form interconnection between first source layers, and the semiconductor device comprises a base contact layer having a higher impurity density than the second base layer of the second conductivity type, and configured to envelope second source layers.

According to another aspect of the present invention, a semiconductor device comprises a first base layer of a first conductivity type having high resistivity, a drain layer of the first conductivity type formed on a reverse side of the first base layer, a buffer layer of a second conductivity type formed on an obverse side of the first base layer, with a higher impurity density than the first base layer, a second base layer of the second conductivity type formed on a surface of the buffer layer, a source layer of the first conductivity type formed on a surface of the second base layer, a set of gate electrodes formed inside trenches extending in a first direction and intruding through the source layer and the second base layer into intermediate depths of the buffer layer, with gate insulating films in between, a drain electrode connected to the drain layer, and a source electrode connected to the source layer and the second base layer, wherein the emitter layer comprises a set of first source layers extending along the trenches in the first direction, and a set of second source layers extending in a second direction perpendicular to the first direction for a ladder form interconnection between first source layers, and the semiconductor device comprises a base contact layer having a higher impurity density than the second base layer of the second conductivity type, and configured to envelope second source layers.

According to another aspect of the present invention, a method of fabricating a semiconductor device comprises preparing a high-resistivity semiconductor substrate of a first conductivity type including a first base layer, forming a collector layer of a second conductivity type on a reverse side of the first base layer, forming a second base layer on an obverse side of the first base layer, forming a base contact layer from surfaces of the first base layer in prescribed surface regions of the second base layer, forming an emitter layer from surfaces of the second base layer in prescribed surface regions of the second base layer including surface regions in which the base contact layer is formed and surface regions extending in a first direction along regions in which trenches are to be formed, forming trench grooves in the first direction, and forming gate insulating films in the trench grooves, forming gate electrodes in the trench grooves, forming an insulating film layer over surfaces of the second base layer, the base contact layer, and the emitter layer, and patterning the insulating film layer into a set of interlayer insulating films on the gate electrodes and the gate insulating films, covering associated trench portions, and forming an emitter electrode over a surface of the semiconductor device, with the set of interlayer insulating films in between.

According to another aspect of the present invention, a method of fabricating a semiconductor device comprises preparing a high-resistivity semiconductor substrate of a first conductivity type including a first base layer, forming a collector layer of a second conductivity type on a reverse side of the first base layer, forming a buffer layer on an obverse side of the first base layer, forming a second base layer on a surface of the buffer layer, forming a base contact layer from surfaces of the buffer layer in prescribed surface regions of the second base layer, forming an emitter layer from surfaces of the second base layer in prescribed surface regions of the second base layer including surface regions in which the base contact layer is formed and surface regions extending in a first direction along regions in which trenches are to be formed, forming trench grooves in the first direction, and forming gate insulating films in the trench grooves, forming gate electrodes in the trench grooves, forming an insulating film layer over surfaces of the second base layer, the base contact layer, and the emitter layer, and patterning the insulating film layer into a set of interlayer insulating films on the gate electrodes and the gate insulating films, covering associated trench portions, and forming an emitter electrode over a surface of the semiconductor device, with the set of interlayer insulating films in between.

According to another aspect of the present invention, a method of fabricating a semiconductor device comprises preparing a high-resistivity semiconductor substrate of a first conductivity type including a first base layer, forming a drain layer of the first conductivity type on a reverse side of the first base layer, forming a second base layer of a second conductivity type on an obverse side of the first base layer, forming a base contact layer from surfaces of the second base layer in prescribed surface regions of the second base layer, forming a source layer from surfaces of the second base layer in prescribed surface regions of the second base layer including surface regions in which the base contact layer is formed and surface regions extending in a first direction along regions in which trenches are to be formed, forming trench grooves in the first direction, and forming gate insulating films in the trench grooves, forming gate electrodes in the trench grooves, forming an insulating film layer over surfaces of the second base layer, the base contact layer, and the source layer, and patterning the insulating film layer into a set of interlayer insulating films on the gate electrodes and the gate insulating films, covering associated trench portions, and forming a source electrode over a surface of the semiconductor device, with the set of interlayer insulating films in between.

According to another aspect of the present invention, a method of fabricating a semiconductor device comprises preparing a high-resistivity semiconductor substrate of a first conductivity type including a first base layer, forming a drain layer of the first conductivity type on a reverse side of the first base layer, forming a buffer layer on an obverse side of the first base layer, forming a second base layer of a second conductivity type on a surface of the buffer layer, forming a base contact layer from surfaces of the buffer layer in prescribed surface regions of the second base layer, forming a source layer from surfaces of the second base layer in prescribed surface regions of the second base layer including surface regions in which the base contact layer is formed and surface regions extending in a first direction along regions in which trenches are to be formed, forming trench grooves in the first direction, and forming gate insulating films in the trench grooves, forming gate electrodes in the trench grooves, forming an insulating film layer over surfaces of the second base layer, the base contact layer, and the source layer, and patterning the insulating film layer into a set of interlayer insulating films on the gate electrodes and the gate insulating films, covering associated trench portions, and forming a source electrode over a surface of the semiconductor device, with the set of interlayer insulating films in between.

According to the aspects of the present invention, it is allowed to provide a semiconductor device including MOSFETs or IGBTs, or a method of fabricating the same, permitting an improved breakdown capability with low power dissipation (low on-state resistance, low saturation voltage).

Further, it is additionally allowed to provide the semiconductor device or the method of fabricating the same with an ability to realize a speedup of switching for IGBTs.

DETAILED DESCRIPTION OF THE EMBODIMENTS

Figure 1:
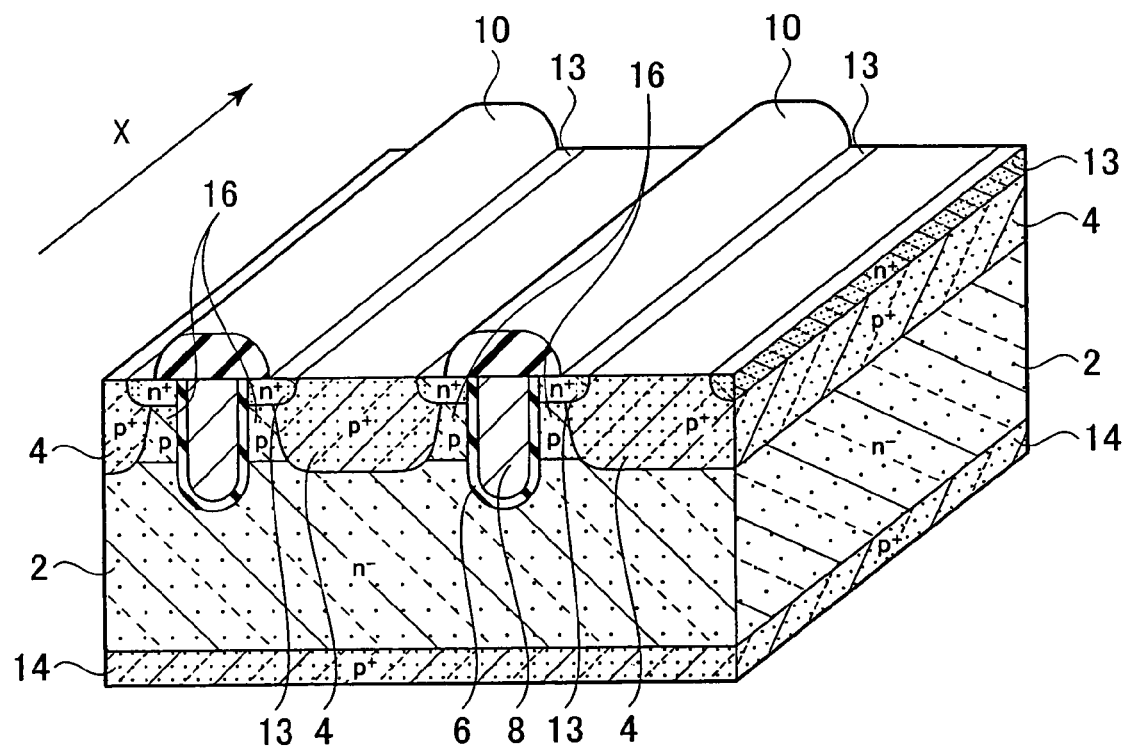
FIG. 1 is a schematic perspective view of a semiconductor device in the past.

There will be described embodiments of the present invention, with reference to the drawings, where like members or elements are designated by like reference characters to eliminate redundancy, and some layers and their subsidiary regions are designated by the same reference characters for simplicity. Drawings are schematic, not actual, and may be inconsistent in between in scale, ratio, etc.

The embodiments to be described are embodiments of a technical concept or spirit of the present invention that is not limited to embodied specifics, and may be changed without departing from the spirit or scope of claims.

First Embodiment (Device Configuration)

Figure 2:
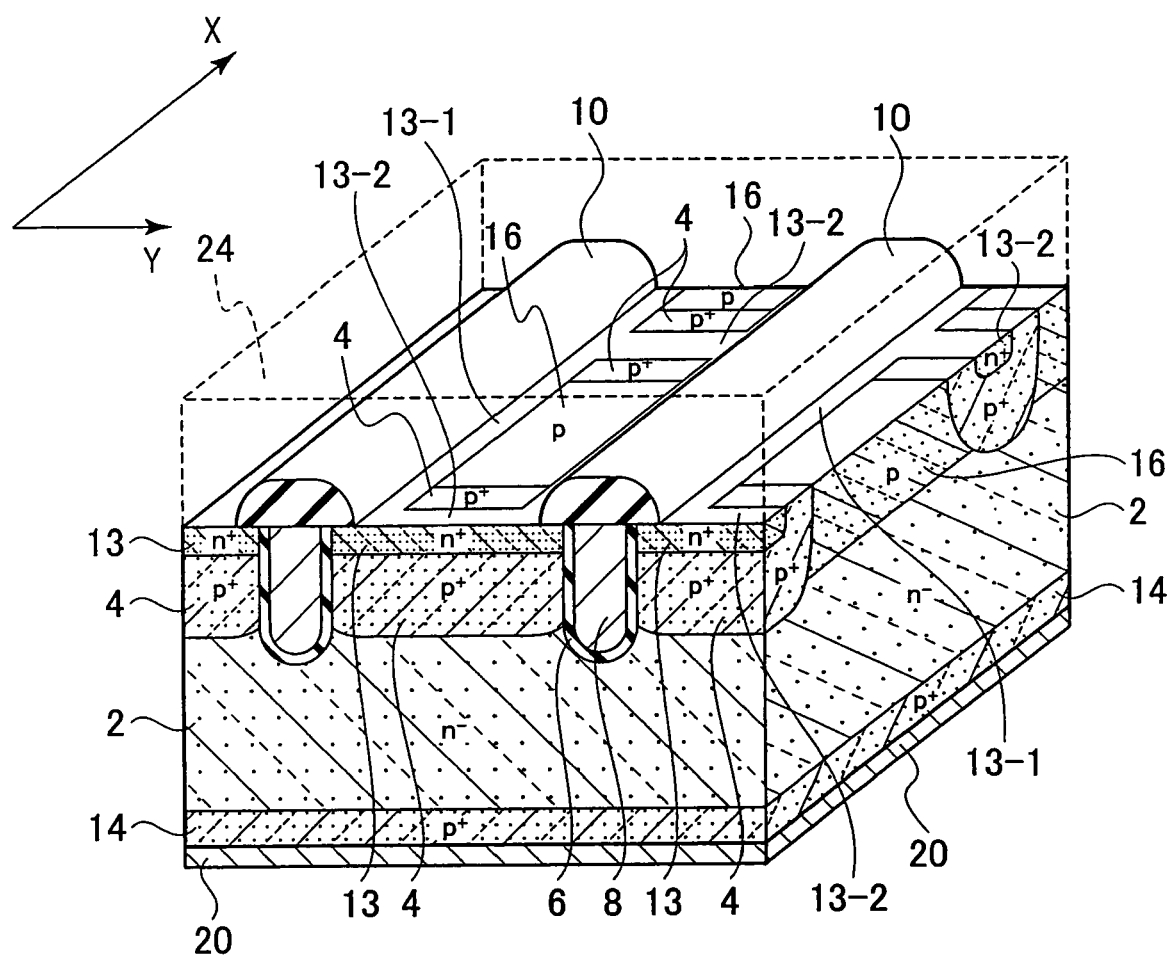
FIG. 2 is a schematic perspective view of a semiconductor device according to a first embodiment of the present invention.

According to a first embodiment of the present invention, a semiconductor device is configured, as schematically illustrated in FIG. 2, including: a first base layer 2 of a first conductivity type, which has high resistivity; a collector layer 14 of a second conductivity type, which is formed on a reverse side of the first base layer 2; a second base layer 16 of the second conductivity type, which is formed finally as a set of regions thereof on associated regions of an obverse surface of the first base layer 2; a base contact layer 4 of the second conductivity type, which is formed finally as a set of regions thereof on associated regions of the obverse surface of the first base layer 2, contacting on associated regions of the second base layer 16; an emitter layer 13 of the first conductivity type, which is formed finally as a set of regions thereof on associated surface regions of the second base layer 16 and the base contact layer 4; a set of gate electrodes 8 formed inside trenches extending in a first direction X and intruding, through the emitter layer 13 and the base contact layer 4 and/or the second base layer 16, into intermediate depths of the first base layer 2, having gate insulating films 6 interposed in between; a collector electrode 20 provided on the collector layer 14; and an emitter electrode 24 provided over the emitter layer 13, the base contact layer 4, and the second base layer 16.

The emitter layer 13 is composed of a set of first emitter layers 13-1 provided as a set of rows of regions thereof extending along associated trenches in the first direction X, and a set of second emitter layers 13-2 provided as a set of arrays of regions thereof extending in a second direction Y perpendicular to the first direction X, each array constituting a ladder form interconnection between an associated pair of first emitter layers 13-1.

In the semiconductor device according to the first embodiment, the base contact layer 4, of which the impurity density is higher than the second base layer 16 of the second conductivity type, has regions thereof arranged to envelope associated regions of second emitter layers 13-2.

In the semiconductor device according to the first embodiment, each combination of gate electrode 8 and gate insulating film 6 defining an associated trench has an interlayer insulating film 10 arranged thereon.

In the semiconductor device according to the first embodiment, the emitter electrode 24 is formed over surfaces of the emitter layer 13, the base contact layer 4, and the second base layer 16, with a set of interlayer insulating films 10 in between.

In the semiconductor device according to the first embodiment, each interlayer insulating film 10 is interposed between the emitter electrode 24 and a combination of associated surface regions of the emitter layer 13, an associated gate electrode 8, and edges of an associated gate insulating film 6.

(Fabrication Method)

Description is now made of a method of fabricating a semiconductor device according to the first embodiment, with reference to FIG. 2.

(a) First, as a high-resistivity first base layer 2 of the first conductivity type, there is prepared a silicon substrate of an n-type that has an impurity density within a range of approximately $10^{12}$ to $10^{15}$ cm$^{-3}$, for example. Then, atoms of an impurity to constitute a p-type impurity, such as boron (B), are doped to the first base layer 2, from a reverse side thereof, by an ion implantation or diffusion process to form a collector layer 14 of the second conductivity type with a thickness within a range of approximately 1 μm to 10 μm, and an impurity density within a range of approximately $10^{18}$ to $10^{20}$ cm$^{-3}$, for example.

(b) Next, atoms of an impurity to constitute a p-type impurity, such as boron (B), are doped to the first base layer 2, from an obverse side thereof, by an ion implantation or diffusion process to form a second base layer 16 with a thickness within a range of approximately 1 μm to 5 μm, and an impurity density within a range of approximately $10^{15}$ to $10^{17}$ cm$^{-3}$, for example.

(c) Next, by a lithographic process, prescribed regions on a surface of the second base layer 16 are defined, where atoms of an impurity to constitute a p-type impurity, such as boron (B), are doped from an obverse side of the second base layer 16 by an ion implantation or diffusion process to form a base contact layer 4. As shown in FIG. 2, the thickness of the base contact layer 4 is comparable with or greater than that of the second base layer 16. The impurity density of the base contact layer 4 is higher than that of the second base layer 16, residing within a range of approximately $10^{16}$ to $10^{20}$ cm$^{-3}$, for example.

(d) Next, by a lithographic process, such regions are defined on the surface of the second base layer 16 that extend as prescribed: within those surface regions in which the base contact layer 4 is formed as a set of regions thereof; or along those surface regions in which trenches are to be formed in a direction X, where atoms of an impurity to constitute an n-type impurity, such as phosphorus (P) or arsenic (As), are doped from the obverse side of the second base layer 16 by an ion implantation or diffusion process to form an emitter layer 13. As shown in FIG. 2, the thickness of the emitter layer 13 is sufficiently small relative to that of the base contact layer 4, within a range of approximately 0.5 μm to 2 μm, for example. The impurity density is within a range of approximately $10^{18}$ to $10^{21}$ cm$^{-3}$, for example.

(e) Next, as illustrated in FIG. 2, the trenches are formed as grooves extending in the first direction X, by an etching process, such as a reactive ion etching (RIE), and thereafter, gate insulating films 6 are formed in the trench grooves by a thermal oxidation process. The trench grooves intrude, through the emitter layer 13 and the base contact layer 4 and/or the second base layer 16, into intermediate depths of the first base layer 2, and have their depths within a range of approximately 2 μm to 7 μm, for example. For the gate insulating films 6, the thickness is set within a range of approximately 40 nm to 200 nm, for example.

(f) Next, the trench grooves are filled with e.g. polysilicon, to form gate electrodes 8.

(g) Next, over surfaces of the second base layer 16, base contact layer 4 and emitter layer 13, there is formed an insulation film layer, which is patterning-processed by an etching to have interlayer insulating films 10 disposed on gate electrodes 8 and edges of gate insulating films 6, covering trench portions.

(h) Next, using aluminum (Al) or the like, an emitter electrode 24 is formed over surface at the obverse side of the semiconductor device, with the interlayer insulating films 10 in between. Concurrently, using aluminum (Al) or the like, a collector electrode 20 is formed over surface at the reverse side of the semiconductor device.

(Characteristics)

Figure 3:
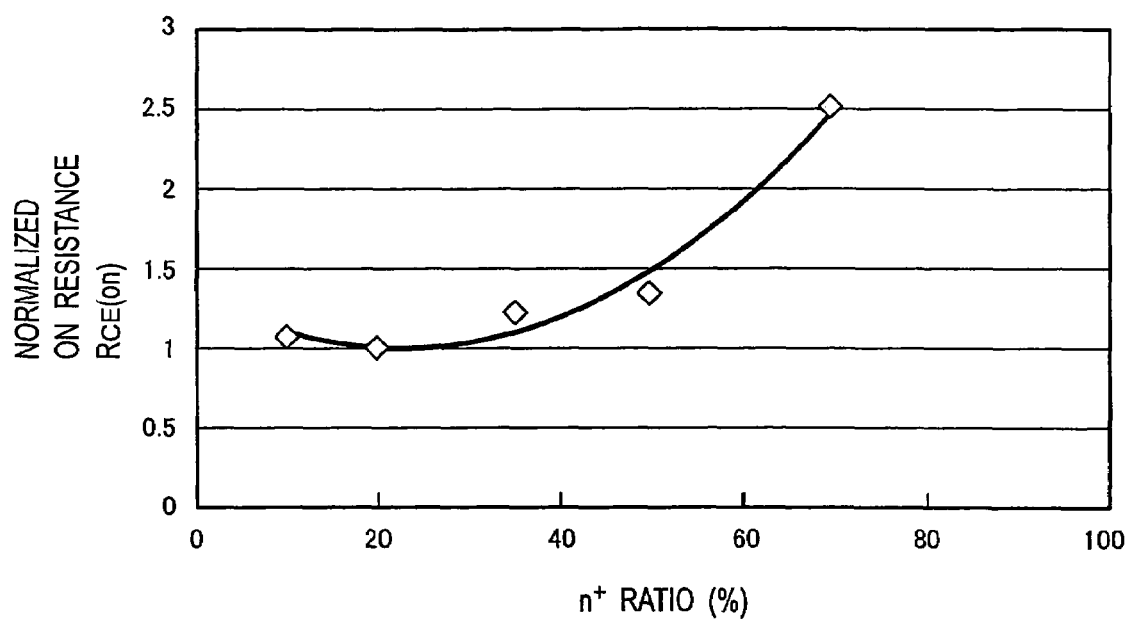
FIG. 3 is a graph showing an exemplary characteristic of a relationship between a normalized on-state resistance $R_{CE(on)}$ and a proportion of an n+ emitter layer in percent ratio of the semiconductor device according to the first embodiment.

FIG. 3 shows a characteristic of a relationship between a normalized on-state resistance $R_{CE(on)}$ and a ratio of n$^+$ emitter layer in the semiconductor device as an IGBT according to the first embodiment.

The ratio of n$^+$ emitter layer is defined as a proportion in percent ratio of a surface area of the emitter layer 13 to a total surface area of the second base layer 16 made of p regions, the base contact layer 4 made of p$^+$ regions, and the emitter layer 13 made of n$^+$ regions over an initial surface of the second base layer 16.

The normalized on-state resistance $R_{CE(on)}$ is a normalized value of an on-state resistance $R_{CE(on)}$ that an IGBT is turned on and has in an on state to conduct collector-emitter current between collector and emitter.

As is apparent from FIG. 3, in the semiconductor device as an IGBT according to the first embodiment, the normalized on-state resistance $R_{CE(on)}$ in on state between collector and emitter is varied in dependence on the ratio of n$^+$ emitter layer, in particular within a range of approximately 10% to approximately 70%, where it has a value within a range of 1 to 2.5. Particularly, it will be seen that the normalized on-state resistance $R_{CE(on)}$ in on state between collector and emitter has a desirable value within a range of 1 to 1.2 for ratios of n$^+$ emitter layer within a range of approximately 10% to approximately 40%.

Figure 4:
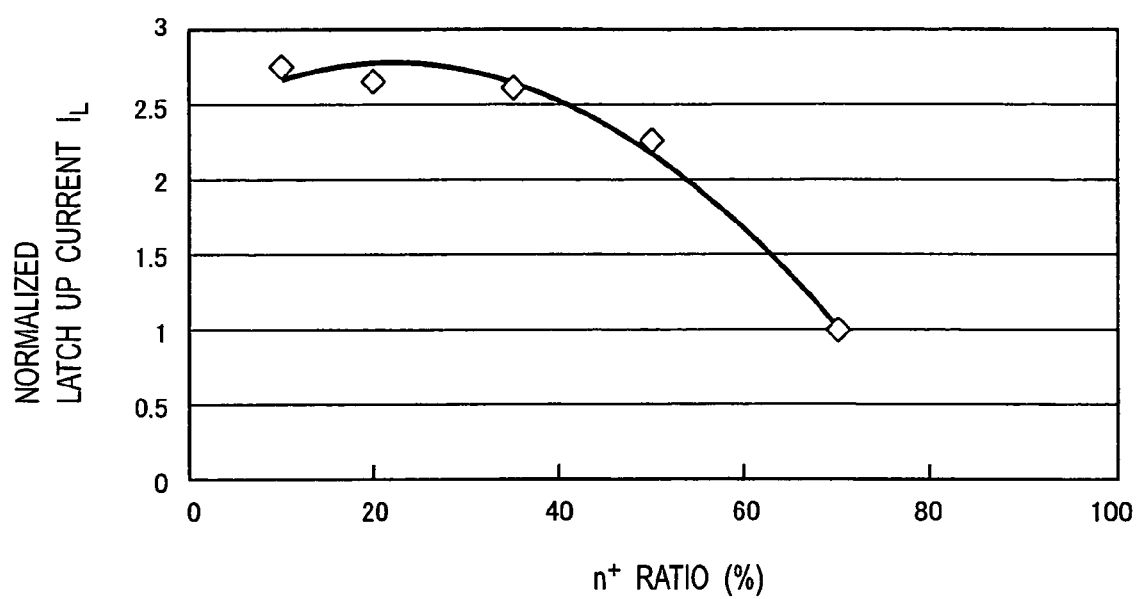
FIG. 4 is a graph showing an exemplary characteristic of a relationship between a normalized latch-up current $I_L$ and the proportion of the n+ emitter layer in percent ratio of the semiconductor device according to the first embodiment.

FIG. 4 shows a characteristic of a relationship between a normalized latch-up current $I_L$ and the ratio of n$^+$ emitter layer of the semiconductor device as an IGBT according to the first embodiment.

The normalized latch-up current $I_L$ is a normalized value of a current that can be latched up in an IGBT. The current that can be latched up decreases as the ratio of n$^+$ emitter layer increases, and the normalized latch-up current $I_L$ is decreased as the ratio of n$^+$ emitter layer is increased.

As is apparent from FIG. 4, in the semiconductor device according to the first embodiment, the normalized latch-up current $I_L$ is varied within a range of approximately 2.7 to approximately 1.0, as the ratio of n$^+$ emitter layer is changed within a range of approximately 10% to approximately 70%.

Particularly, it will be seen from FIG. 4 that in the semiconductor device according to the first embodiment, the normalized latch-up current $I_L$ has a desirable value of 2.5 or more for ratios of n$^+$ emitter layer within a range of approximately 10% to approximately 40%.

Accordingly, in the semiconductor device according to the first embodiment, the emitter layer 13 formed over an initial surface of the second base layer 16 has a surface area ratio between approximately 10% and approximately 70%, preferably between approximately 10% and approximately 40%.

In the semiconductor device according to the first embodiment being an IGBT having a trench type stripe cell as a basic structure, first emitter layers 13-1 are arranged along trenches extending in a first direction X, and second emitter layers 13-2 are arranged so as to extend in a second direction Y perpendicular to the first direction X for a ladder form interconnection between the first emitter layers 13-1, to have an increased contact area with the first emitter layers 13-1.

The semiconductor device according to the first embodiment has the base contact layer 4 configured to envelope the second emitter layers 13-2. As a result, in the semiconductor device according to the first embodiment, the emitter layer 13 composed of the first emitter layers 13-1 and the second emitter layers 13-2, as well as the base contact layer 4, has a ladder-shaped plane pattern.

In the semiconductor device according to the present embodiment, in which the base contact layer 4 constitutes wrappings around the second emitter layers 13-2, it is allowed for parasitic bipolar transistors of n$^+$(13-2), p$^+$ (4), and n$^-$ (2) to have reduced base resistances. As a result, the latch-up capability in IGBT action can be enhanced. Therefore, the dv/dt capability of IGBT can be increased, allowing for an improved breakdown capability.

In the semiconductor device according to the present embodiment, p$^+$ regions of the base contact layer 4 are localized on a surface of the second base layer 16, whereby those regions to be occupied by p$^+$ channel portions (of the base contact layer 4) are minimized, concurrently allowing for a reduced on-state resistance.

In the semiconductor device according to the present embodiment, the areas to be occupied by the base contact layer 4 and the second base layer 16 are set large relative to the emitter layer 13, thereby permitting holes to be efficiently absorbed into the emitter electrode 24 in a turn-off switching state, allowing for a speedup of IGBT turn-off switching.

In the semiconductor device according to the present embodiment, patterns of first emitter layer 13-1, second emitter layer 13-2, base contact layer 4, and second base layer 16 are repeated along trenches in a first direction X, and in a second direction Y perpendicular to the first direction, whereof the settings for repetition may be arbitrarily determined in accordance with desirable characteristics of breakdown capability and on-state resistance.

In the semiconductor device according to the present embodiment, the area occupied by the second base layer 16 may be set wider than those occupied by the first emitter layers 13-1 and the second emitter layers 13-2, allowing for a promoted reduction of on-state resistance.

Modification of First Embodiment (Device Configuration)

Figure 5:
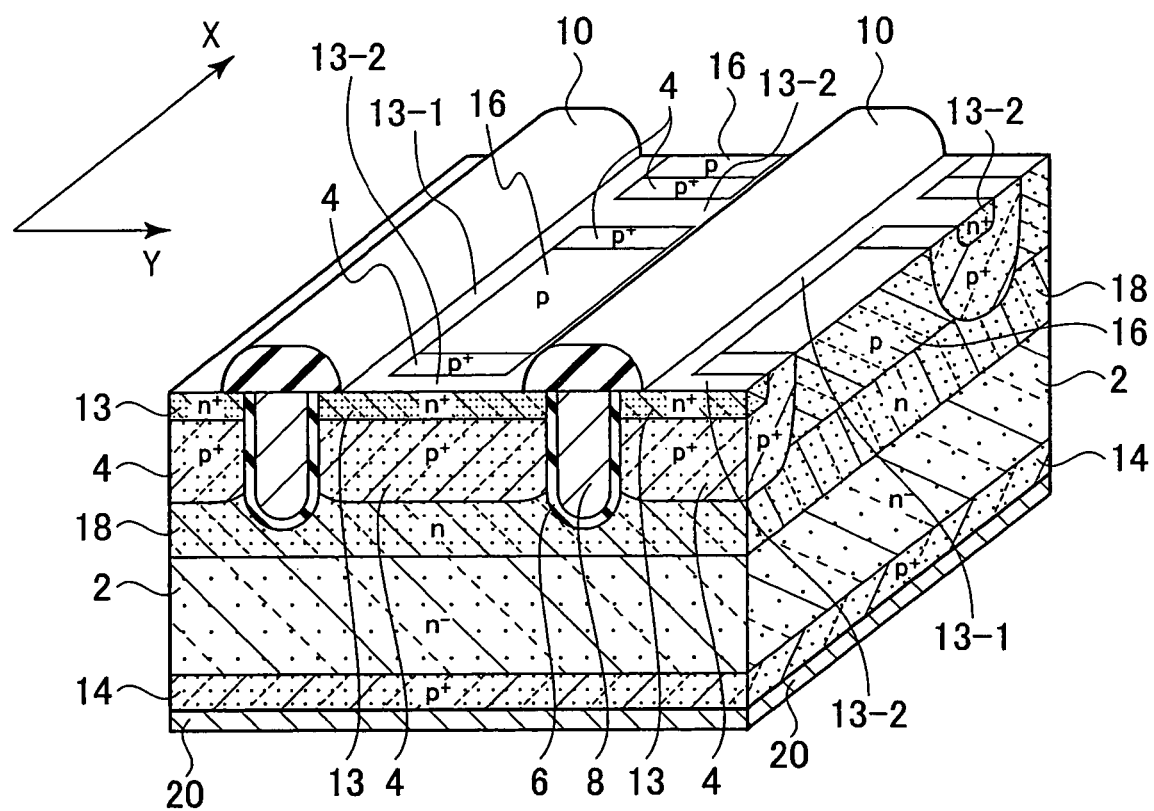
FIG. 5 is a schematic perspective view of a semiconductor device according to a modification of the first embodiment.

According to a modification of the first embodiment of the present invention, a semiconductor device is configured, as illustrated in FIG. 5, including: a first base layer 2 of a first conductivity type, which has high resistivity; a collector layer 14 of a second conductivity type, which is formed on a reverse side of the first base layer 2; a buffer layer 18 of the first conductivity type, which is formed on an obverse side of the first base layer 2, and has a higher impurity density than the first base layer 2; a second base layer 16 of the second conductivity type, which is formed finally as a set of regions thereof on associated regions of a surface of the buffer layer 18; a base contact layer 4 of the second conductivity type, which is formed finally as a set of regions thereof on associated regions of the surface of the buffer layer 18, contacting on associated regions of the second base layer 16; an emitter layer 13 of the first conductivity type, which is formed finally as a set of regions thereof on associated surface regions of the second base layer 16 and the base contact layer 4; a set of gate electrodes 8 formed inside trenches extending in a first direction X and intruding, through the emitter layer 13 and the base contact layer 4 and/or the second base layer 16, into intermediate depths of the buffer layer 18, having gate insulating films 6 interposed in between; a collector electrode 20 connected to the collector layer 14; and an emitter electrode (not shown) connected to the emitter layer 13, the base contact layer 4, and the second base layer 16.

The emitter layer 13 is composed of a set of first emitter layers 13-1 provided as a set of rows of regions thereof extending along associated trenches in the first direction X, and a set of second emitter layers 13-2 provided as a set of arrays of regions thereof extending in a second direction Y perpendicular to the first direction X, each array constituting a ladder form interconnection between an associated pair of first emitter layers 13-1.

In the semiconductor device according to the modification of the first embodiment, the base contact layer 4, of which the impurity density is higher than the second base layer 16 of the second conductivity type, has regions thereof arranged to envelope associated regions of second emitter layers 13-2.

In the semiconductor device according to the modification of the first embodiment, each combination of gate electrode 8 and gate insulating film 6 defining an associated trench has an interlayer insulating film 10 arranged thereon.

In the semiconductor device according to the modification of the first embodiment, the unshown emitter electrode is formed over surfaces of the emitter layer 13, the base contact layer 4, and the second base layer 16, with a set of interlayer insulating films 10 in between.

In the semiconductor device according to the modification of the first embodiment, each interlayer insulating film 10 is interposed between the unshown emitter electrode and a combination of associated surface regions of the emitter layer 13, an associated gate electrode 8, and edges of an associated gate insulating film 6.

(Fabrication Method)

Description is now made of a method of fabricating a semiconductor device according to the modification of the first embodiment, with reference to FIG. 5.

(a) First, as a high-resistivity first base layer 2 of the first conductivity type, there is prepared a silicon substrate of an n-type that has an impurity density within a range of approximately $10^{12}$ to $10^{15}$ cm$^{-3}$, for example. Then, atoms of an impurity to constitute a p-type impurity, such as boron (B), are doped to the first base layer 2, from a reverse side thereof, by an ion implantation or diffusion process to form a collector layer 14 of the second conductivity type with a thickness within a range of approximately 1 μm to 10 μm, and an impurity density within a range of approximately $10^{18}$ to $10^{20}$ cm$^{-3}$, for example.

(b) Next, atoms of an impurity to constitute an n-type impurity, such as phosphorus (P), are doped to the first base layer 2, from an obverse side thereof, by an ion implantation or diffusion process to form a buffer layer 18 with a thickness within a range of approximately 5 μm to 10 μm, and an impurity density within a range of approximately $10^{15}$ to $10^{17}$ cm$^{-3}$, for example.

(c) Next, atoms of an impurity to constitute a p-type impurity, such as boron (B), are doped to the buffer layer 18, from an obverse side thereof, by an ion implantation or diffusion process to form a second base layer 16 with a thickness within a range of approximately 1 μm to 5 μm, and an impurity density within a range of approximately $10^{15}$ to $10^{17}$ cm$^{-3}$, for example.

(d) Next, by a lithographic process, prescribed regions on a surface of the second base layer 16 are defined, where atoms of an impurity to constitute a p-type impurity, such as boron (B), are doped from an obverse side of the second base layer 16 by an ion implantation or diffusion process to form a base contact layer 4. As shown in FIG. 5, the thickness of the base contact layer 4 is comparable with or greater than that of the second base layer 16. The impurity density of the base contact layer 4 is higher than that of the second base layer 16, residing within a range of approximately $10^{16}$ to $10^{20}$ cm$^{-3}$, for example.

(e) Next, by a lithographic process, such regions are defined on the surface of the second base layer 16 that extend as prescribed: within those surface regions in which the base contact layer 4 is formed as a set of regions thereof; or along those surface regions in which trenches are to be formed in a direction X, where atoms of an impurity to constitute an n-type impurity, such as phosphorus (P) or arsenic (As), are doped from the obverse side of the second base layer 16 by an ion implantation or diffusion process to form an emitter layer 13. As shown in FIG. 5, the thickness of the emitter layer 13 is sufficiently small relative to that of the base contact layer 4, within a range of approximately 0.5 μm to approximately 2 μm, for example. The impurity density is within a range of approximately $10^{18}$ to $10^{21}$ cm$^{-3}$, for example.

(f) Next, as illustrated in FIG. 5, the trenches are formed as grooves extending in the first direction X, by an etching process, such as an RIE, and thereafter, gate insulating films 6 are formed in the trench grooves by a thermal oxidation process. The trench grooves intrude, through the emitter layer 13 and the base contact layer 4 and/or the second base layer 16, into intermediate depths of the buffer layer 18, and have their depths within a range of approximately 2 μm to 7 μm, for example. For the gate insulating films 6, the thickness is set within a range of approximately 40 nm to 200 nm, for example.

(g) Next, the trench grooves are filled with e.g. polysilicon, to form gate electrodes 8.

(h) Next, over surfaces of the second base layer 16, base contact layer 4 and emitter layer 13, there is formed an insulation film layer, which is patterning-processed by an etching to have interlayer insulating films 10 disposed on gate electrodes 8 and edges of gate insulating films 6, covering trench portions.

(i) Next, using aluminum (Al) or the like, an emitter electrode 24 is formed over surface at the obverse side of the semiconductor device, with the interlayer insulating films 10 in between. Concurrently, using aluminum (Al) or the like, a collector electrode 20 is formed over surface at the reverse side of the semiconductor device.

(Characteristics)

The semiconductor device according to the modification of the first embodiment has such a characteristic as illustrated in FIG. 3 for the relationship between a normalized on-state resistance $R_{CE(on)}$ and a ratio of $n^+$ emitter layer in the semiconductor device as an IGBT, and such a characteristic as illustrated in FIG. 4 for the relationship between a normalized latch-up current $I_L$ and the ratio of $n^+$ emitter layer.

Accordingly, in the semiconductor device according to the modification of the first embodiment, the emitter layer 13 formed over an initial surface of the second base layer 16 has a surface area ratio between approximately 10% and approximately 70%, preferably between approximately 10% and approximately 40%.

In the semiconductor device according to the modification of the first embodiment, the buffer layer 18 extends between the first base layer 2 and the second base layer 16, and between the first base layer 2 and the base contact layer 4, thus constituting an n(13) $p^+$(4) p(16) n(18) $n^-$(2) $p^+$(14) structure, whereby it is allowed to control a punching-through between the emitter layer 13 and the collector layer 14. As a result, the latch-up capability in IGBT action can be enhanced. Therefore, the dv/dt capability of IGBT can be increased, allowing for an improved breakdown capability.

According to the first embodiment or the modification thereof, it is allowed to provide a semiconductor device including IGBTs permitting an improved breakdown capability with low power dissipation (low on-state resistance, low saturation voltage), as well as a method of fabricating the same. It is additionally allowed to provide the semiconductor device including IGBTs with an ability to realize a speedup of switching, as well as a method of fabricating the same.

Second Embodiment (Device Configuration)

Figure 6:
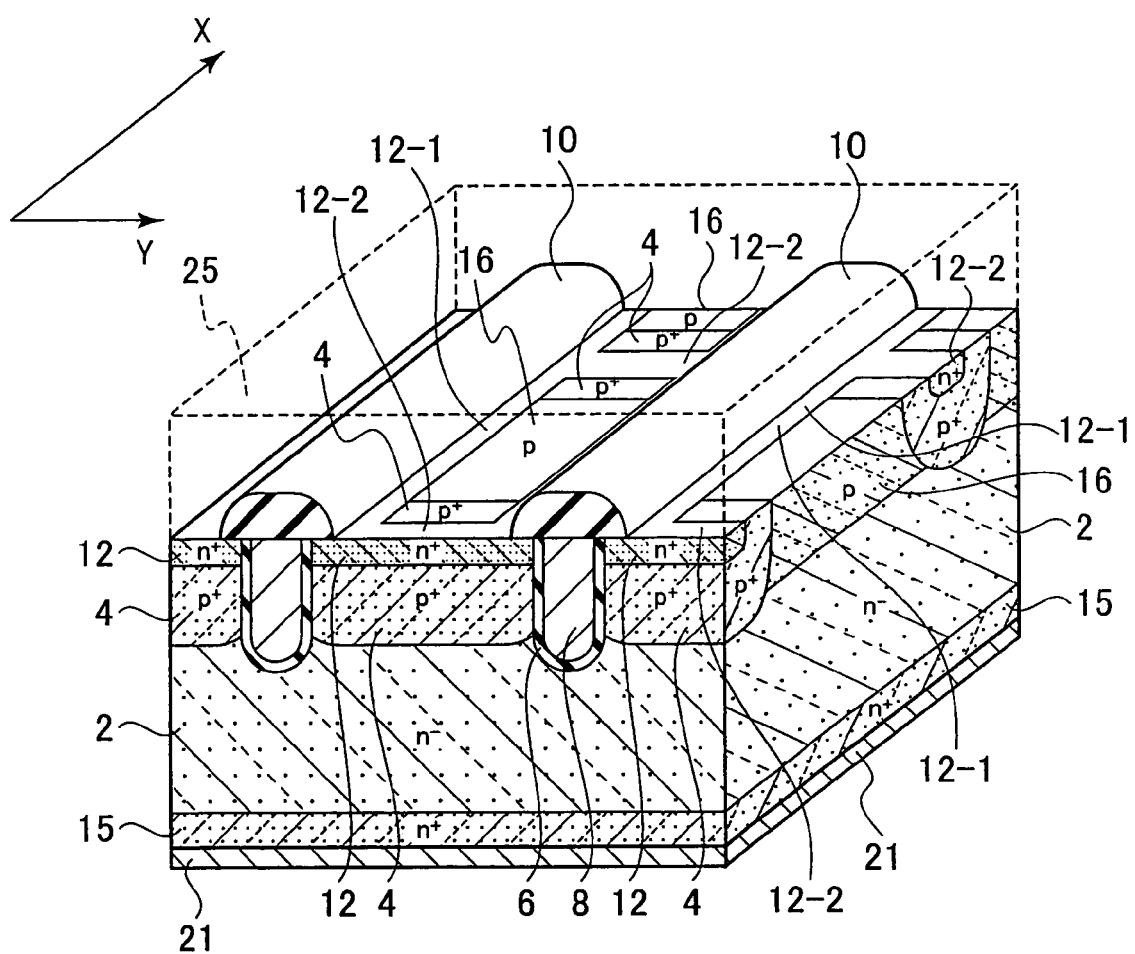
FIG. 6 is a schematic perspective view of a semiconductor device according to a second embodiment of the present invention.

According to a second embodiment of the present invention, a semiconductor device is configured, as schematically illustrated in FIG. 6, including: a first base layer 2 of a first conductivity type, which has high resistivity; a drain layer 15 of a second conductivity type, which is formed on a reverse side of the first base layer 2; a second base layer 16 of the second conductivity type, which is formed finally as a set of regions thereof on associated regions of an obverse surface of the first base layer 2; a base contact layer 4 of the second conductivity type, which is formed finally as a set of regions thereof on associated regions of the obverse surface of the first base layer 2, contacting on associated regions of the second base layer 16; a source layer 12 of the first conductivity type, which is formed finally as a set of regions thereof on associated surface regions of the second base layer 16 and the base contact layer 4; a set of gate electrodes 8 formed inside trenches extending in a first direction X and intruding, through the source layer 12 and the base contact layer 4 and/or the second base layer 16, into intermediate depths of the first base layer 2, having gate insulating films 6 interposed in between; a drain electrode 21 provided on the drain layer 15; and a source electrode 25 provided over the source layer 12, the base contact layer 4, and the second base layer 16.

The source layer 12 is composed of a set of first source layers 12-1 provided as a set of rows of regions thereof extending along associated trenches in the first direction X, and a set of second source layers 12-2 provided as a set of arrays of regions thereof extending in a second direction Y perpendicular to the first direction X, each array constituting a ladder form interconnection between an associated pair of first source layers 12-1.

The base contact layer 4, of which the impurity density is higher than the second base layer 16 of the second conductivity type, has regions thereof arranged to envelope associated regions of second source layers 12-2.

In the semiconductor device according to the second embodiment, each combination of gate electrode 8 and gate insulating film 6 defining an associated trench has an interlayer insulating film 10 arranged thereon.

In the semiconductor device according to the second embodiment, the source electrode 25 is formed over surfaces of the source electrode 12, the base contact layer 4, and the second base layer 16, with a set of interlayer insulating films 10 in between.

In the semiconductor device according to the second embodiment, each interlayer insulating film 10 is interposed between the source electrode 25 and a combination of associated surface regions of the source layer 12, an associated gate electrode 8, and edges of an associated gate insulating film 6.

(Fabrication Method)

Description is now made of a method of fabricating a semiconductor device according to the second embodiment, with reference to FIG. 6.

(a) First, as a high-resistivity first base layer 2 of the first conductivity type, there is prepared a silicon substrate of an n-type that has an impurity density within a range of approximately $10^{12}$ to $10^{15}$ cm$^{-3}$, for example. Then, atoms of an impurity to constitute an n-type impurity, such as phosphorus (P) or arsenic (As), are doped to the first base layer 2, from a reverse side thereof, by an ion implantation or diffusion process to form a drain layer 15 of the first conductivity type with a thickness within a range of approximately 1 μm to 10 μm, and an impurity density within a range of approximately $10^{18}$ to $10^{21}$ cm$^{-3}$, for example.

(b) Next, atoms of an impurity to constitute a p-type impurity, such as boron (B), are doped to the first base layer 2, from an obverse side thereof, by an ion implantation or diffusion process to form a second base layer 16 with a thickness within a range of approximately 1 μm to 5 μm, and an impurity density within a range of approximately $10^{15}$ to $10^{17}$ cm$^{-3}$, for example.

(c) Next, by a lithographic process, prescribed regions on a surface of the second base layer 16 are defined, where atoms of an impurity to constitute a p-type impurity, such as boron (B), are doped from an obverse side of the second base layer 16 by an ion implantation or diffusion process to form a base contact layer 4. As shown in FIG. 6, the thickness of the base contact layer 4 is comparable with or greater than that of the second base layer 16. The impurity density of the base contact layer 4 is higher than that of the second base layer 16, residing within a range of approximately $10^{16}$ to $10^{20}$ cm$^{-3}$, for example.

(d) Next, by a lithographic process, such regions are defined on the surface of the second base layer 16 that extend as prescribed: within those surface regions in which the base contact layer 4 is formed as a set of regions thereof; or along those surface regions in which trenches are to be formed in a direction X, where atoms of an impurity to constitute an n-type impurity, such as phosphorus (P) or arsenic (As), are doped from the obverse side of the second base layer 16 by an ion implantation or diffusion process to form a source layer 12. As shown in FIG. 6, the thickness of the source layer 12 is sufficiently small relative to that of the base contact layer 4, within a range of approximately 0.5 μm to 2 μm, for example. The impurity density is within a range of approximately $10^{18}$ to $10^{21}$ cm$^{-3}$, for example.

(e) Next, as illustrated in FIG. 6, the trenches are formed as grooves extending in the first direction X, by an etching process, such as an RIE, and thereafter, gate insulating films 6 are formed in the trench grooves by a thermal oxidation process. The trench grooves intrude, through the source layer 12 and the base contact layer 4 and/or the second base layer 16, into intermediate depths of the first base layer 2, and have their depths within a range of approximately 2 μm to 7 μm, for example. For the gate insulating films 6, the thickness is set within a range of approximately 40 nm to 200 nm, for example.

(f) Next, the trench grooves are filled with e.g. polysilicon, to form gate electrodes 8.

(g) Next, over surfaces of the second base layer 16, base contact layer 4 and source layer 12, there is formed an insulation film layer, which is patterning-processed by an etching to have interlayer insulating films 10 disposed on gate electrodes 8 and edges of gate insulating films 6, covering trench portions.

(h) Next, using aluminum (Al) or the like, a source electrode 25 is formed over surface at the obverse side of the semiconductor device, with the interlayer insulating films 10 in between. Concurrently, using aluminum (Al) or the like, a drain electrode 21 is formed over surface at the reverse side of the semiconductor device.

(Characteristics)

The semiconductor device according to the second embodiment has such a characteristic as illustrated in FIG. 3 for a relationship between a normalized on-state resistance $R_{DS(on)}$ and a ratio of n+ source layer in the semiconductor device as a MOSFET.

The ratio of n$^+$ source layer is defined as a proportion in percent ratio of a surface area of the source layer 12 to a total surface area of the second base layer 16 made of p regions, the base contact layer 4 made of p$^+$ regions, and the source layer 12 made of n$^+$ regions over an initial surface of the second base layer 16.

The normalized on-state resistance $R_{DS(on)}$ is a normalized value of an on-state resistance $R_{DS(on)}$ that a MOSFET has in an on state between source and drain.

In the semiconductor device as a MOSFET according to the second embodiment, the normalized on-state resistance $R_{DS(on)}$ in on state between source and drain is varied in dependence on the ratio of n$^+$ source layer, in particular within a range of approximately 10% to approximately 70%, where it has a value within a range of 1 to 2.5. Particularly, the normalized on-state resistance $R_{DS(on)}$ in on state between source and drain has a desirable value within a range of 1 to 1.2 for ratios of n$^+$ source layer within a range of approximately 10% to approximately 40%.

Accordingly, in the semiconductor device according to the second embodiment, the source layer 12 formed over an initial surface of the second base layer 16 has a surface area ratio between approximately 10% and approximately 70%, preferably between approximately 10% and approximately 40%.

In the semiconductor device according to the second embodiment being a MOSFET having a trench type stripe cell as a basic structure, first source layers 12-1 are arranged along trenches extending in a first direction X, and second source layers 12-2 are arranged so as to extend in a second direction Y perpendicular to the first direction X for a ladder form interconnection between the first source layers 12-1, to have an increased contact area with the first source layers 12-1.

The semiconductor device according to the second embodiment has the base contact layer 4 configured to envelope the second source layers 12-2. As a result, in the semiconductor device according to the second embodiment, the source layer 12 composed of the first source layers 12-1 and the second source layers 12-2, as well as the base contact layer 4, has a ladder-shaped plane pattern.

In the semiconductor device according to the second embodiment, in which the base contact layer 4 constitutes wrappings around the second source layers 12-2, it is allowed for parasitic bipolar transistors of n$^+$ (12-2), p$^+$ (4), and n$^-$ (2) to have reduced base resistances. As a result, the dv/dt capability of MOSFET can be increased, allowing for an improved breakdown capability.

In the semiconductor device according to the second embodiment, p$^+$ regions of the base contact layer 4 are localized on a surface of the second base layer 16, whereby those regions to be occupied by p$^+$ channel portions (of the base contact layer 4) are minimized, concurrently allowing for a reduced on-state resistance.

In the semiconductor device according to the second embodiment, the areas to be occupied by the base contact layer 4 and the second base layer 16 are set large relative to the source layer 12, thereby permitting holes to be efficiently absorbed into the source electrode 25 in a turn-off switching state, allowing for a speedup of MOSFET turn-off switching.

In the semiconductor device according to the second embodiment, patterns of first source layer 12-1, second source layer 12-2, base contact layer 4, and second base layer 16 are repeated along trenches in a first direction X, and in a second direction Y perpendicular to the first direction X, whereof the settings for repetition may be arbitrarily determined in accordance with desirable characteristics of breakdown capability and on-state resistance.

In the semiconductor device according to the second embodiment, the area occupied by the second base layer 16 may be set wider than those occupied by the first source layers 12-1 and the second source layers 12-2, allowing for a promoted reduction of on-state resistance.

Modification of Second Embodiment (Device Configuration)

Figure 7:
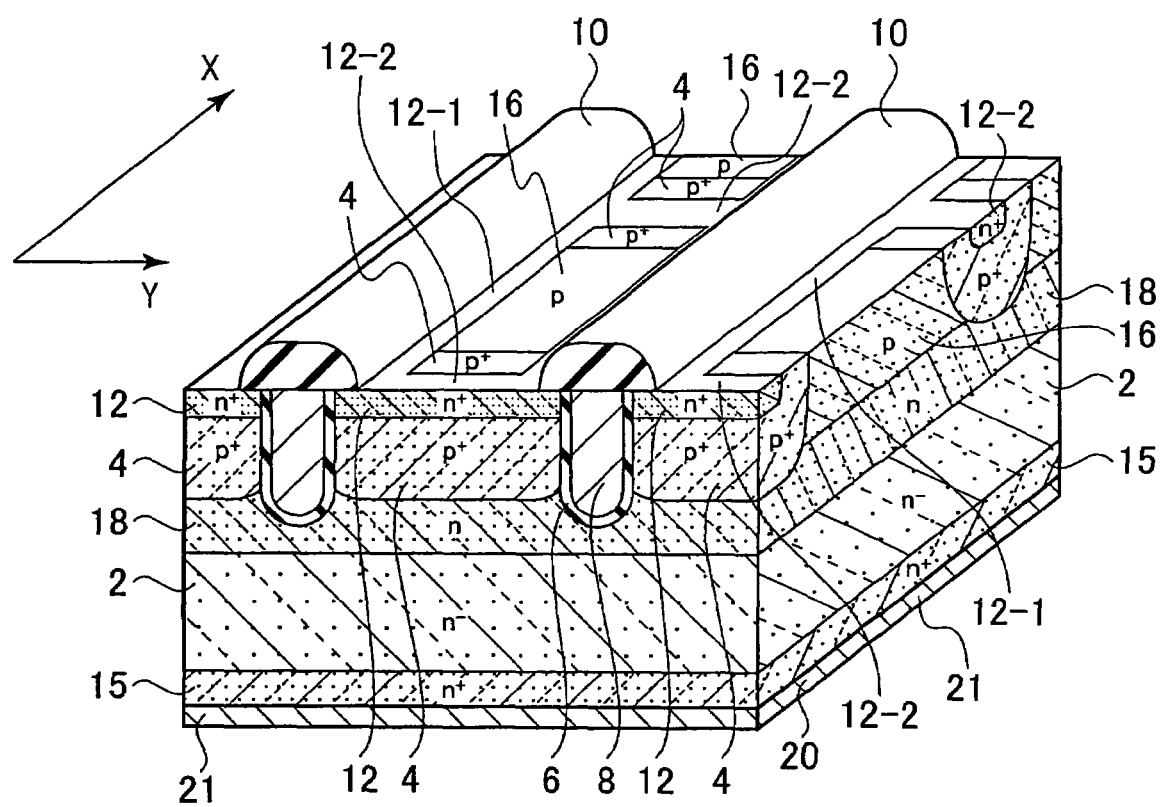
FIG. 7 is a schematic perspective view of a semiconductor device according to a modification of the second embodiment.

According to a modification of the second embodiment of the present invention, a semiconductor device is configured, as illustrated in FIG. 7, including: a first base layer 2 of a first conductivity type, which has high resistivity; a drain layer 15 of a second conductivity type, which is formed on a reverse side of the first base layer 2; a buffer layer 18 of the first conductivity type, which is formed on an obverse side of the first base layer 2, and has a higher impurity density than the first base layer 2; a second base layer 16 of the second conductivity type, which is formed finally as a set of regions thereof on associated regions of a surface of the buffer layer

18; a base contact layer 4 of the second conductivity type, which is formed finally as a set of regions thereof on associated regions of the surface of the buffer layer 18, contacting on associated regions of the second base layer 16; a source layer 12 of the first conductivity type, which is formed finally as a set of regions thereof on associated surface regions of the second base layer 16 and the base contact layer 4; a set of gate electrodes 8 formed inside trenches extending in a first direction X and intruding, through the source layer 12 and the base contact layer 4 and/or the second base layer 16, into intermediate depths of the buffer layer 18, having gate insulating films 6 interposed in between; a drain electrode 21 connected to the drain layer 15; and a source electrode (not shown) connected to the source layer 12, the base contact layer 4, and the second base layer 16.

The source layer 12 is composed of a set of first source layers 12-1 provided as a set of rows of regions thereof extending along associated trenches in the first direction X, and a set of second source layers 12-2 provided as a set of arrays of regions thereof extending in a second direction Y perpendicular to the first direction X, each array constituting a ladder form interconnection between an associated pair of first source layers 12-1.

In the semiconductor device according to the modification of the second embodiment, the base contact layer 4, of which the impurity density is higher than the second base layer 16 of the second conductivity type, has regions thereof arranged to envelope associated regions of second source layers 12-2.

In the semiconductor device according to the modification of the second embodiment, each combination of gate electrode 8 and gate insulating film 6 defining an associated trench has an interlayer insulating film 10 arranged thereon.

In the semiconductor device according to the modification of the second embodiment, the unshown source electrode is formed over surfaces of the source electrode 12, the base contact layer 4, and the second base layer 16, with a set of interlayer insulating films 10 in between.

In the semiconductor device according to the modification of the second embodiment, each interlayer insulating film 10 is interposed between the unshown emitter electrode and a combination of associated surface regions of the source layer 12, an associated gate electrode 8, and edges of an associated gate insulating film 6.

(Fabrication Method)

Description is now made of a method of fabricating a semiconductor device according to the modification of the second embodiment, with reference to FIG. 7.

(a) First, as a high-resistivity first base layer 2 of the first conductivity type, there is prepared a silicon substrate of an n-type that has an impurity density within a range of approximately $10^{12}$ to $10^{15}$ cm$^{-3}$, for example. Then, atoms of an impurity to constitute a n-type impurity, such as phosphorus (P) or arsenic (As), are doped to the first base layer 2, from a reverse side thereof, by an ion implantation or diffusion process to form a drain layer 15 of the first conductivity type with a thickness within a range of approximately 1 μm to 10 μm, and an impurity density within a range of approximately $10^{18}$ to $10^{21}$ cm$^{-3}$, for example.

(b) Next, atoms of an impurity to constitute an n-type impurity, such as phosphorus (P), are doped to the first base layer 2, from an obverse side thereof, by an ion implantation or diffusion process to form a buffer layer 18 with a thickness within a range of approximately 5 μm to 10 μm, and an impurity density within a range of approximately $10^{15}$ to $10^{17}$ cm$^{-3}$, for example.

(c) Next, atoms of an impurity to constitute a p-type impurity, such as boron (B), are doped to the buffer layer 18, from an obverse side thereof, by an ion implantation or diffusion process to form a second base layer 16 with a thickness within a range of approximately 1 μm to 5 μm, and an impurity density within a range of approximately $10^{15}$ to $10^{17}$ cm$^{-3}$, for example.

(d) Next, by a lithographic process, prescribed regions on a surface of the second base layer 16 are defined, where atoms of an impurity to constitute a p-type impurity, such as boron (B), are doped from an obverse side of the second base layer 16 by an ion implantation or diffusion process to form a base contact layer 4. As shown in FIG. 7, the thickness of the base contact layer 4 is comparable with or greater than that of the second base layer 16. The impurity density of the base contact layer 4 is higher than that of the second base layer 16, residing within a range of approximately $10^{16}$ to $10^{20}$ cm$^{-3}$, for example.

(e) Next, by a lithographic process, such regions are defined on the surface of the second base layer 16 that extend as prescribed: within those surface regions in which the base contact layer 4 is formed as a set of regions thereof; or along those surface regions in which trenches are to be formed in a direction X, where atoms of an impurity to constitute an n-type impurity, such as phosphorus (P) or arsenic (As), are doped from the obverse side of the second base layer 16 by an ion implantation or diffusion process to form a source layer 12. As shown in FIG. 7, the thickness of the source layer 12 is sufficiently small relative to that of the base contact layer 4, within a range of approximately 0.5 μm to approximately 2 μm, for example. The impurity density is within a range of approximately $10^{18}$ to $10^{21}$ cm$^{-3}$, for example.

(f) Next, as illustrated in FIG. 7, the trenches are formed as grooves extending in the first direction X, by an etching process, such as an RIE, and thereafter, gate insulating films 6 are formed in the trench grooves by a thermal oxidation process. The trench grooves intrude, through the source layer 12 and the base contact layer 4 and/or the second base layer 16, into intermediate depths of the buffer layer 18, and have their depths within a range of approximately 2 μm to 7 μm, for example. For the gate insulating films 6, the thickness is set within a range of approximately 40 nm to 200 nm, for example.

(g) Next, the trench grooves are filled with e.g. polysilicon, to form gate electrodes 8.

(h) Next, over surfaces of the second base layer 16, base contact layer 4 and source layer 12, there is formed an insulation film layer, which is patterning-processed by an etching to have interlayer insulating films 10 disposed on gate electrodes 8 and edges of gate insulating films 6, covering trench portions.

(i) Next, using aluminum (Al) or the like, a source electrode 25 is formed over surface at the obverse side of the semiconductor device, with the interlayer the insulating films 10 in between. Concurrently, using aluminum (Al) or the like, a drain electrode 21 is formed over surface at the reverse side of the semiconductor device.

(Characteristics)

The semiconductor device according to the modification of the second embodiment has such a characteristic as illustrated in FIG. 3 for the relationship between a normalized on-state resistance $R_{DS(on)}$ and a ratio of n$^+$ emitter layer in the semiconductor device as a MOSFET.

Accordingly, in the semiconductor device according to the modification of the second embodiment, the source layer 12 formed over an initial surface of the second base layer 16 has a surface area ratio between approximately 10% and approximately 70%, preferably between approximately 10% and approximately 40%.

In the semiconductor device according to the modification of the second embodiment, the buffer layer 18 extends between the first base layer 2 and the second base layer 16, and between the first base layer 2 and the base contact layer 4, thus constituting an n(12) p$^+$(4) p(16) n(18) n$^-$(2) n$^+$(15) structure, whereby it is allowed to control a punching-through between the source layer 12 and the drain layer 15. As a result, the dv/dt capability of MOSFET can be increased, allowing for an improved breakdown capability of MOSFET.

According to the second embodiment or the modification thereof, it is allowed to provide a semiconductor device including MOSFETs permitting an improved breakdown capability with low power dissipation (low on-state resistance, low saturation voltage), as well as a method of fabricating the same.

Other Embodiments

The present invention has been described by the first and second embodiments and their modifications, as a disclosure including associated description and drawings to be construed as illustrative, not restrictive. With the disclosure, artisan might easily think up alternative embodiments, embodiment examples, or application techniques.

It will be seen that the embodiments of the present invention, as well as the modifications, have come up with implied structural innovations for a semiconductor device with an enhanced breakdown capability, including application of a guard ring structure or field plate structure.

According to any one of the embodiments or modifications described, the method of fabricating a semiconductor device employs a sequence of ion implantation or diffusion processes, which may be substituted by applicable measures, such as a wafer bonding process in which wafers are bonded together.

Such being the case, the present invention covers a variety of embodiments, whether described or not.

INDUSTRIAL APPLICABILITY

According to the present invention, a semiconductor device is applicable to varieties of AC to AC, AC to DC, DC to DC, and DC to AC power transducers, encompassing from small power to large power, including a DC-DC converter, and a PWM inverter.

What is claimed is:

1. A semiconductor device comprising:
   a first base layer of a first conductivity type having high resistivity;
   a collector layer of a second conductivity type formed on a reverse side of the first base layer;
   a second base layer of the second conductivity type formed on an obverse side of the first base layer;
   an emitter layer of the first conductivity type formed on a surface of the second base layer;
   a set of gate electrodes formed inside trenches extending in a first direction and intruding through the emitter layer and the second base layer into intermediate depths of the first base layer, with gate insulating films in between;
   a collector electrode connected to the collector layer; and
   an emitter electrode connected to the emitter layer and the second base layer, wherein
   the emitter layer comprises:
   a set of first emitter layers extending along the trenches in the first direction; and
   a set of second emitter layers extending in a second direction perpendicular to the first direction for a ladder form interconnection between first emitter layers, and
   the semiconductor device comprises a base contact layer having a higher impurity density than the second base layer of the second conductivity type, and configured to envelope second emitter layers.

2. The semiconductor device as claimed in claim 1, comprising a set of interlayer insulating films disposed on the gate electrodes and the gate insulating films defining the trenches.

3. The semiconductor device as claimed in claim 2, wherein the emitter electrode is formed over surfaces of the emitter layer and the second base layer, with the set of interlayer insulating films in between.

4. The semiconductor device as claimed in claim 2, wherein the emitter electrode is formed over surfaces of the emitter layer, the second base layer, and the base contact layer, with the set of interlayer insulating films in between.

5. The semiconductor device as claimed in claim 1, wherein the emitter layer formed on the surface of the second base layer has a surface area ratio between 10% and 70%.

6. A semiconductor device comprising:
   a first base layer of a first conductivity type having high resistivity;
   a collector layer of a second conductivity type formed on a reverse side of the first base layer;
   a buffer layer of the first conductivity type formed on an obverse side of the first base layer, with a higher impurity density than the first base layer;
   a second base layer of the second conductivity type formed on a surface of the buffer layer;
   an emitter layer of the first conductivity type formed on a surface of the second base layer;
   a set of gate electrodes formed inside trenches extending in a first direction and intruding through the emitter layer and the second base layer into intermediate depths of the buffer layer, with gate insulating films in between;
   a collector electrode connected to the collector layer; and
   an emitter electrode connected to the emitter layer and the second base layer, wherein
   the emitter layer comprises:
   a set of first emitter layers extending along the trenches in the first direction; and
   a set of second emitter layers extending in a second direction perpendicular to the first direction for a ladder form interconnection between first emitter layers, and
   the semiconductor device comprises a base contact layer having a higher impurity density than the second base layer of the second conductivity type, and configured to envelope second emitter layers.

7. The semiconductor device as claimed in claim 6, comprising a set of interlayer insulating films disposed on the gate electrodes and the gate insulating films defining the trenches.

8. The semiconductor device as claimed in claim 7, wherein the emitter electrode is formed over surfaces of the emitter layer and the second base layer, with the set of interlayer insulating films in between.

9. The semiconductor device as claimed in claim 7, wherein the emitter electrode is formed over surfaces of the emitter layer, the second base layer, and the base contact layer, with the set of interlayer insulating films in between.

10. The semiconductor device as claimed in claim 6, wherein the emitter layer formed on the surface of the second base layer has a surface area ratio between 10% and 70%.

11. A semiconductor device comprising:
a first base layer of a first conductivity type having high resistivity;
a drain layer of the first conductivity type formed on a reverse side of the first base layer;
a second base layer of a second conductivity type formed on an obverse side of the first base layer;
a source layer of the first conductivity type formed on a surface of the second base layer;
a set of gate electrodes formed inside trenches extending in a first direction and intruding through the source layer and the second base layer into intermediate depths of the first base layer, with gate insulating films in between;
a drain electrode connected to the drain layer; and
a source electrode connected to the source layer and the second base layer, wherein
the source layer comprises:
a set of first source layers extending along the trenches in the first direction; and
a set of second source layers extending in a second direction perpendicular to the first direction for a ladder form interconnection between first source layers, and
the semiconductor device comprises a base contact layer having a higher impurity density than the second base layer of the second conductivity type, and configured to envelope second source layers.

12. The semiconductor device as claimed in claim 11, comprising a set of interlayer insulating films disposed on the gate electrodes and the gate insulating films defining the trenches.

13. The semiconductor device as claimed in claim 12, wherein the source electrode is formed over surfaces of the source layer and the second base layer, with the set of interlayer insulating films in between.

14. The semiconductor device as claimed in claim 12, wherein the source electrode is formed over surfaces of the source layer, the second base layer, and the base contact layer, with the set of interlayer insulating films in between.

15. A semiconductor device comprising:
a first base layer of a first conductivity type having high resistivity;
a drain layer of the first conductivity type formed on a reverse side of the first base layer;
a buffer layer of a second conductivity type formed on an obverse side of the first base layer, with a higher impurity density than the first base layer;
a second base layer of the second conductivity type formed on a surface of the buffer layer;
a source layer of the first conductivity type formed on a surface of the second base layer;
a set of gate electrodes formed inside trenches extending in a first direction and intruding through the source layer and the second base layer into intermediate depths of the buffer layer, with gate insulating films in between;
a drain electrode connected to the drain layer; and
a source electrode connected to the source layer and the second base layer, wherein
the emitter layer comprises:
a set of first source layers extending along the trenches in the first direction; and
a set of second source layers extending in a second direction perpendicular to the first direction for a ladder form interconnection between first source layers, and
the semiconductor device comprises a base contact layer having a higher impurity density than the second base layer of the second conductivity type, and configured to envelope second source layers.

16. The semiconductor device as claimed in claim 15, comprising a set of interlayer insulating films disposed on the gate electrodes and the gate insulating films defining the trenches.

17. The semiconductor device as claimed in claim 16, wherein the source electrode is formed over surfaces of the source layer and the second base layer, with the set of interlayer insulating films in between.

18. The semiconductor device as claimed in claim 16, wherein the source electrode is formed over surfaces of the source layer, the second base layer, and the base contact layer, with the set of interlayer insulating films in between.

19. A method of fabricating a semiconductor device, comprising the steps of:
preparing a high-resistivity semiconductor substrate of a first conductivity type including a first base layer;
forming a collector layer of a second conductivity type on a reverse side of the first base layer;
forming a second base layer on an obverse side of the first base layer;
forming a base contact layer from surfaces of the first base layer in prescribed surface regions of the second base layer;
forming an emitter layer from surfaces of the second base layer in prescribed surface regions of the second base layer including surface regions in which the base contact layer is formed and surface regions extending in a first direction along regions in which trenches are to be formed;
forming trench grooves in the first direction, and forming gate insulating films in the trench grooves;
forming gate electrodes in the trench grooves;
forming an insulating film layer over surfaces of the second base layer, the base contact layer, and the emitter layer, and patterning the insulating film layer into a set of interlayer insulating films on the gate electrodes and the gate insulating films, covering associated trench portions; and
forming an emitter electrode over a surface of the semiconductor device, with the set of interlayer insulating films in between.

20. A method of fabricating a semiconductor device, comprising the steps of:
preparing a high-resistivity semiconductor substrate of a first conductivity type including a first base layer;
forming a collector layer of a second conductivity type on a reverse side of the first base layer;
forming a buffer layer on an obverse side of the first base layer;
forming a second base layer on a surface of the buffer layer;
forming a base contact layer from surfaces of the buffer layer in prescribed surface regions of the second base layer;
forming an emitter layer from surfaces of the second base layer in prescribed surface regions of the second base layer including surface regions in which the base contact layer is formed and surface regions extending in a first direction along regions in which trenches are to be formed;
forming trench grooves in the first direction, and forming gate insulating films in the trench grooves;
forming gate electrodes in the trench grooves;
forming an insulating film layer over surfaces of the second base layer, the base contact layer, and the emitter layer, and patterning the insulating film layer into a set of interlayer insulating films on the gate electrodes and the gate insulating films, covering associated trench portions; and forming an emitter electrode over a surface of the semiconductor device, with the set of interlayer insulating films in between.

21. A method of fabricating a semiconductor device, comprising the steps of:

preparing a high-resistivity semiconductor substrate of a first conductivity type including a first base layer;

forming a drain layer of the first conductivity type on a reverse side of the first base layer;

forming a second base layer of a second conductivity type on an obverse side of the first base layer;

forming a base contact layer from surfaces of the second base layer in prescribed surface regions of the second base layer;

forming a source layer from surfaces of the second base layer in prescribed surface regions of the second base layer including surface regions in which the base contact layer is formed and surface regions extending in a first direction along regions in which trenches are to be formed;

forming trench grooves in the first direction, and forming gate insulating films in the trench grooves;

forming gate electrodes in the trench grooves;

forming an insulating film layer over surfaces of the second base layer, the base contact layer, and the source layer, and patterning the insulating film layer into a set of interlayer insulating films on the gate electrodes and the gate insulating films, covering associated trench portions; and forming a source electrode over a surface of the semiconductor device, with the set of interlayer insulating films in between.

22. A method of fabricating a semiconductor device, comprising the steps of:

preparing a high-resistivity semiconductor substrate of a first conductivity type including a first base layer;

forming a drain layer of the first conductivity type on a reverse side of the first base layer;

forming a buffer layer on an obverse side of the first base layer;

forming a second base layer of a second conductivity type on a surface of the buffer layer;

forming a base contact layer from surfaces of the buffer layer in prescribed surface regions of the second base layer;

forming a source layer from surfaces of the second base layer in prescribed surface regions of the second base layer including surface regions in which the base contact layer is formed and surface regions extending in a first direction along regions in which trenches are to be formed;

forming trench grooves in the first direction, and forming gate insulating films in the trench grooves;

forming gate electrodes in the trench grooves;

forming an insulating film layer over surfaces of the second base layer, the base contact layer, and the source layer, and patterning the insulating film layer into a set of interlayer insulating films on the gate electrodes and the gate insulating films, covering associated trench portions; and forming a source electrode over a surface of the semiconductor device, with the set of interlayer insulating films in between.

* * * * *